United States Patent
Zhao et al.

(10) Patent No.: US 10,193,003 B2
(45) Date of Patent: Jan. 29, 2019

(54) SOLAR CELL UNIT, SOLAR CELL ARRAY, SOLAR CELL MODULE AND MANUFACTURING METHOD THEREOF

(71) Applicant: BYD COMPANY LIMITED, Shenzhen (CN)

(72) Inventors: Zhiqiang Zhao, Shenzhen (CN); Zhanfeng Jiang, Shenzhen (CN); Long He, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 131 days.

(21) Appl. No.: 14/738,587

(22) Filed: Jun. 12, 2015

(65) Prior Publication Data

US 2016/0126366 A1    May 5, 2016

(30) Foreign Application Priority Data

| Oct. 31, 2014 | (CN) | 2014 1 0606601 |
|---|---|---|
| Oct. 31, 2014 | (CN) | 2014 1 0606607 |
| Oct. 31, 2014 | (CN) | 2014 1 0606675 |
| Oct. 31, 2014 | (CN) | 2014 1 0606700 |
| Oct. 31, 2014 | (CN) | 2014 1 0608469 |
| Oct. 31, 2014 | (CN) | 2014 1 0608576 |
| Oct. 31, 2014 | (CN) | 2014 1 0608577 |
| Oct. 31, 2014 | (CN) | 2014 1 0608579 |
| Oct. 31, 2014 | (CN) | 2014 1 0608580 |
| Feb. 17, 2015 | (CN) | 2015 1 0085666 |

(Continued)

(51) Int. Cl.
*H01L 31/00* (2006.01)
*H01L 31/02* (2006.01)
(Continued)

(52) U.S. Cl.
CPC .. *H01L 31/02008* (2013.01); *H01L 31/02013* (2013.01); *H01L 31/022433* (2013.01);
(Continued)

(58) Field of Classification Search
CPC .................. H01L 31/02008; H01L 31/02013
(Continued)

(56) References Cited

U.S. PATENT DOCUMENTS

| 4,336,648 A | 6/1982 | Pschunder et al. |
|---|---|---|
| 4,574,160 A | 3/1986 | Cull et al. |

(Continued)

FOREIGN PATENT DOCUMENTS

| CN | 102237425 A | 11/2011 |
|---|---|---|
| CN | 202434543 U | 9/2012 |

(Continued)

*Primary Examiner* — Shannon M Gardner
(74) *Attorney, Agent, or Firm* — Brinks Gilson & Lione

(57) ABSTRACT

A solar cell unit comprises a cell. The cell includes a cell substrate and a plurality of secondary grid lines disposed on a front surface of the cell substrate. The secondary grid lines comprises an edge secondary grid line adjacent to an edge of the cell substrate and a middle secondary grid line disposed inside of the edge secondary grid line. The secondary grid line comprises a welding portion. At least one welding portion of the edge secondary grid line has a projection area in the cell substrate larger than a welding portion of the middle secondary grid line. The solar cell unit also comprises a plurality of conductive wires spaced apart from each other and welded with the secondary grid lines in the welding portion.

18 Claims, 6 Drawing Sheets

(30) Foreign Application Priority Data

| Apr. 30, 2015 | (CN) | 2015 1 0217551 |
|---|---|---|
| Apr. 30, 2015 | (CN) | 2015 1 0217573 |
| Apr. 30, 2015 | (CN) | 2015 1 0217609 |
| Apr. 30, 2015 | (CN) | 2015 1 0217616 |
| Apr. 30, 2015 | (CN) | 2015 1 0217617 |
| Apr. 30, 2015 | (CN) | 2015 1 0217625 |
| Apr. 30, 2015 | (CN) | 2015 1 0217687 |
| Apr. 30, 2015 | (CN) | 2015 1 0218489 |
| Apr. 30, 2015 | (CN) | 2015 1 0218535 |
| Apr. 30, 2015 | (CN) | 2015 1 0218562 |
| Apr. 30, 2015 | (CN) | 2015 1 0218563 |
| Apr. 30, 2015 | (CN) | 2015 1 0218574 |
| Apr. 30, 2015 | (CN) | 2015 1 0218635 |
| Apr. 30, 2015 | (CN) | 2015 1 0218697 |
| Apr. 30, 2015 | (CN) | 2015 1 0219182 |
| Apr. 30, 2015 | (CN) | 2015 1 0219353 |
| Apr. 30, 2015 | (CN) | 2015 1 0219366 |
| Apr. 30, 2015 | (CN) | 2015 1 0219378 |
| Apr. 30, 2015 | (CN) | 2015 1 0219417 |
| Apr. 30, 2015 | (CN) | 2015 1 0219436 |
| Apr. 30, 2015 | (CN) | 2015 1 0219540 |
| Apr. 30, 2015 | (CN) | 2015 1 0219565 |
| Apr. 30, 2015 | (CN) | 2015 1 0221302 |
| Apr. 30, 2015 | (CN) | 2015 2 0276309 |
| Apr. 30, 2015 | (CN) | 2015 2 0276534 |
| Apr. 30, 2015 | (CN) | 2015 2 0277480 |
| Apr. 30, 2015 | (CN) | 2015 2 0278149 |
| Apr. 30, 2015 | (CN) | 2015 2 0278183 |
| Apr. 30, 2015 | (CN) | 2015 2 0278409 |
| Apr. 30, 2015 | (CN) | 2015 2 0280778 |
| Apr. 30, 2015 | (CN) | 2015 2 0280868 |

(51) Int. Cl.
*H01L 31/048* (2014.01)
*H01L 31/05* (2014.01)
*H01L 31/0224* (2006.01)
*H01L 31/18* (2006.01)

(52) U.S. Cl.
CPC ........ *H01L 31/048* (2013.01); *H01L 31/0488* (2013.01); *H01L 31/0504* (2013.01); *H01L 31/0508* (2013.01); *H01L 31/18* (2013.01); *Y02E 10/50* (2013.01)

(58) Field of Classification Search
USPC .......................................................... 136/244
See application file for complete search history.

(56) References Cited

U.S. PATENT DOCUMENTS

| 5,380,371 | A | 1/1995 | Murakami |
|---|---|---|---|
| 6,021,099 | A | 2/2000 | Aoki et al. |
| 6,710,239 | B2 | 3/2004 | Tanaka |
| 6,870,087 | B1 | 3/2005 | Gallagher |
| 7,432,438 | B2 | 10/2008 | Rubin et al. |
| 2002/0148499 | A1 | 10/2002 | Tanaka |
| 2005/0268959 | A1 | 12/2005 | Aschenbrenner |
| 2006/0283496 | A1 | 12/2006 | Okamoto et al. |
| 2007/0095387 | A1 | 5/2007 | Fuji et al. |
| 2007/0186968 | A1 | 8/2007 | Nakauchi et al. |
| 2007/0209697 | A1 | 9/2007 | Karakida et al. |
| 2008/0083453 | A1 | 4/2008 | Rose et al. |
| 2009/0038679 | A1 | 2/2009 | Varghese et al. |
| 2009/0120490 | A1 | 5/2009 | Huang et al. |
| 2009/0173385 | A1 | 7/2009 | Kost et al. |
| 2009/0242013 | A1 | 10/2009 | Taguchi |
| 2010/0000602 | A1 | 1/2010 | Gray et al. |
| 2010/0043863 | A1 | 2/2010 | Wudu et al. |
| 2010/0055822 | A1 | 3/2010 | Weidman |
| 2010/0089447 | A1 | 5/2010 | Basol et al. |
| 2010/0275976 | A1 | 11/2010 | Rubin et al. |
| 2011/0048492 | A1 | 3/2011 | Nishiwaki |
| 2011/0290298 | A1 | 12/2011 | Krause et al. |
| 2012/0138141 | A1 | 6/2012 | Kim et al. |
| 2012/0192932 | A1 | 8/2012 | Wu et al. |
| 2012/0234379 | A1 | 9/2012 | Takenaka |
| 2012/0253541 | A1 | 10/2012 | Arditi et al. |
| 2013/0074902 | A1 | 3/2013 | Taira |
| 2013/0269748 | A1 | 10/2013 | Wiedeman |
| 2014/0048752 | A1 | 2/2014 | Akimoto |
| 2014/0182651 | A1 | 7/2014 | Rogerson et al. |

FOREIGN PATENT DOCUMENTS

| CN | 202678326 U | 1/2013 |
|---|---|---|
| CN | 202721137 U | 2/2013 |
| CN | 202839628 U | 3/2013 |
| CN | 203221719 U | 10/2013 |
| CN | 103489931 A | 1/2014 |
| CN | 203932074 U | 11/2014 |
| CN | 204243052 U | 4/2015 |
| CN | 104752556 A | 7/2015 |
| WO | WO 2015101252 A1 | 7/2015 |

SOLAR CELL UNIT, SOLAR CELL ARRAY, SOLAR CELL MODULE AND MANUFACTURING METHOD THEREOF

The present application claims priority to the following 41 Chinese applications, the entireties of all of which are hereby incorporated by reference.

1. Chinese Patent Application No. 201410608576.6, filed Oct. 31, 2014;
2. Chinese Patent Application No. 201410606607.4, filed Oct. 31, 2014;
3. Chinese Patent Application No. 201410606601.7, filed Oct. 31, 2014;
4. Chinese Patent Application No. 201410606675.0, filed Oct. 31, 2014;
5. Chinese Patent Application No. 201410608579.X, filed Oct. 31, 2014;
6. Chinese Patent Application No. 201410608577.0, filed Oct. 31, 2014;
7. Chinese Patent Application No. 201410608580.2, filed Oct. 31, 2014;
8. Chinese Patent Application No. 201410606700.5, filed Oct. 31, 2014;
9. Chinese Patent Application No. 201410608469.3, filed Oct. 31, 2014;
10. Chinese Patent Application No. 201510085666.6, filed Feb. 17, 2015;
11. Chinese Patent Application No. 201510217625.8, filed Apr. 30, 2015;
12. Chinese Patent Application No. 201510217609.9, filed Apr. 30, 2015;
13. Chinese Patent Application No. 201520276309.3, filed Apr. 30, 2015;
14. Chinese Patent Application No. 201510217687.9, filed Apr. 30, 2015;
15. Chinese Patent Application No. 201510219182.6, filed Apr. 30, 2015;
16. Chinese Patent Application No. 201510217617.3, filed Apr. 30, 2015;
17. Chinese Patent Application No. 201520278183.3, filed Apr. 30, 2015;
18. Chinese Patent Application No. 201510217573.4, filed Apr. 30, 2015;
19. Chinese Patent Application No. 201510219540.3, filed Apr. 30, 2015;
20. Chinese Patent Application No. 201510218489.4, filed Apr. 30, 2015;
21. Chinese Patent Application No. 201510218563.2, filed Apr. 30, 2015;
22. Chinese Patent Application No. 201510219565.3, filed Apr. 30, 2015;
23. Chinese Patent Application No. 201510219436.4, filed Apr. 30, 2015;
24. Chinese Patent Application No. 201510218635.3, filed Apr. 30, 2015;
25. Chinese Patent Application No. 201520277480.6, filed Apr. 30, 2015;
26. Chinese Patent Application No. 201510219366.2, filed Apr. 30, 2015;
27. Chinese Patent Application No. 201520278409.X, filed Apr. 30, 2015;
28. Chinese Patent Application No. 201510218697.4, filed Apr. 30, 2015;
29. Chinese Patent Application No. 201510219417.1, filed Apr. 30, 2015;
30. Chinese Patent Application No. 201510221302.6, filed Apr. 30, 2015;
31. Chinese Patent Application No. 201510219353.5, filed Apr. 30, 2015;
32. Chinese Patent Application No. 201520280778.2, filed Apr. 30, 2015;
33. Chinese Patent Application No. 201510219378.5, filed Apr. 30, 2015;
34. Chinese Patent Application No. 201520280868.1, filed Apr. 30, 2015;
35. Chinese Patent Application No. 201510218574.0, filed Apr. 30, 2015;
36. Chinese Patent Application No. 201510217616.9, filed Apr. 30, 2015;
37. Chinese Patent Application No. 201520278149.6, filed Apr. 30, 2015;
38. Chinese Patent Application No. 201510218562.8, filed Apr. 30, 2015;
39. Chinese Patent Application No. 201510218535.0, filed Apr. 30, 2015;
40. Chinese Patent Application No. 201510217551.8, filed Apr. 30, 2015; and
41. Chinese Patent Application No. 201520276534.7, filed Apr. 30, 2015.

The present application is relevant to the following 10 U.S. applications, filed concurrently with the present application, the entireties of which are hereby incorporated by reference.

U.S. patent application Ser. No. 14/738,244, entitled "Solar Cell Module And Manufacturing Method Thereof," filed Jun. 12, 2015;

U.S. patent application Ser. No. 14/738,322, entitled "Solar Cell Array, Solar Cell Module And Manufacturing Method Thereof," filed Jun. 12, 2015;

U.S. patent application Ser. No. 14/738,368, entitled "Solar Cell Array, Solar Cell Module And Manufacturing Method Thereof," filed Jun. 12, 2015;

U.S. patent application Ser. No. 14/738,390, entitled "Solar Cell Module And Manufacturing Method Thereof," filed Jun. 12, 2015;

U.S. patent application Ser. No. 14/738,409, entitled "Solar Cell Array, Solar Cell Module And Manufacturing Method Thereof," filed Jun. 12, 2015;

U.S. patent application Ser. No. 14/738,677, entitled "Solar Cell Unit, Solar Cell Array, Solar Cell Module And Manufacturing Method Thereof," filed Jun. 12, 2015;

U.S. patent application Ser. No. 14/738,664, entitled "Solar Cell Unit, Solar Cell Array, Solar Cell Module And Manufacturing Method Thereof," filed Jun. 12, 2015;

U.S. patent application Ser. No. 14/738,516, entitled "Solar Cell Unit, Solar Cell Array, Solar Cell Module And Manufacturing Method Thereof," filed Jun. 12, 2015;

U.S. patent application Ser. No. 14/738,578, entitled "Solar Cell Unit, Solar Cell Array, Solar Cell Module And Manufacturing Method Thereof," filed Jun. 12, 2015; and U.S. patent application Ser. No. 14/738,637, entitled "Method For Manufacturing Solar Cell Module," filed Jun. 12, 2015

FIELD

The present disclosure relates to the field of solar cells, and more particularly, to solar cell units, solar cell arrays, solar cell modules and manufacturing methods thereof.

BACKGROUND

A solar cell module is one of the most important components of a solar power generation device. Sunlight irradiates to a cell from its front surface and is converted to electricity within the cell. The cell includes a cell substrate and primary grid lines and secondary grid lines disposed on the front surface of the cell substrate. The primary grid lines and secondary grid lines cover part of the front surface of the cell substrate, which blocks part of the sunlight, and then the part of sunlight irradiating to the primary grid lines and the secondary grid lines cannot be converted into electric energy. Thus, the primary grid lines and the secondary grid lines need to be as fine as possible in order for the solar cell module to receive more sunlight. However, the primary grid lines and the secondary grid lines serve to conduct current, and in terms of resistivity, the finer the primary grid lines and the secondary grid lines are, the smaller the cross section area thereof is, which causes greater loss of electricity due to increased resistivity. Therefore, the primary grid lines and the secondary grid lines must be designed to achieve a balance between light blocking and electric conduction, and to take the cost into consideration.

SUMMARY

In one aspect, a solar cell unit comprises a cell. The cell includes a cell substrate and a plurality of secondary grid lines disposed on a front surface of the cell substrate. The secondary grid lines comprises an edge secondary grid line adjacent to an edge of the cell substrate and a middle secondary grid line disposed inside of the edge secondary grid line. The secondary grid line comprises a welding portion. At least one welding portion of the edge secondary grid line has a projection area in the cell substrate larger than a welding portion of the middle secondary grid line. The solar cell unit also comprises a plurality of conductive wires spaced apart from each other and welded with the secondary grid lines in the welding portion.

In another aspect, a method for manufacturing a solar cell module comprises providing a cell. The cell includes a cell substrate and a plurality of secondary grid lines disposed on a front surface of the cell substrate. The secondary grid lines comprises an edge secondary grid line adjacent to an edge of the cell substrate and a middle secondary grid line disposed inside of the edge secondary grid line. The secondary grid line comprises a welding portion. At least one welding portion of the edge secondary grid line has a projection area in the cell substrate larger than a welding portion of the middle secondary grid line. The method also comprises connecting conductive wires comprising a metal wire with the secondary grid lines in the welding portion to obtain a solar cell unit. The method further comprises superposing an upper cover plate, a front adhesive layer, the solar cell unit, a back adhesive layer and a back plate in sequence. A front surface of the solar cell unit faces the front adhesive layer. A back surface thereof faces the back adhesive layer. The method also comprises laminating the superposed layers to obtain the solar cell module.

Figure 1:
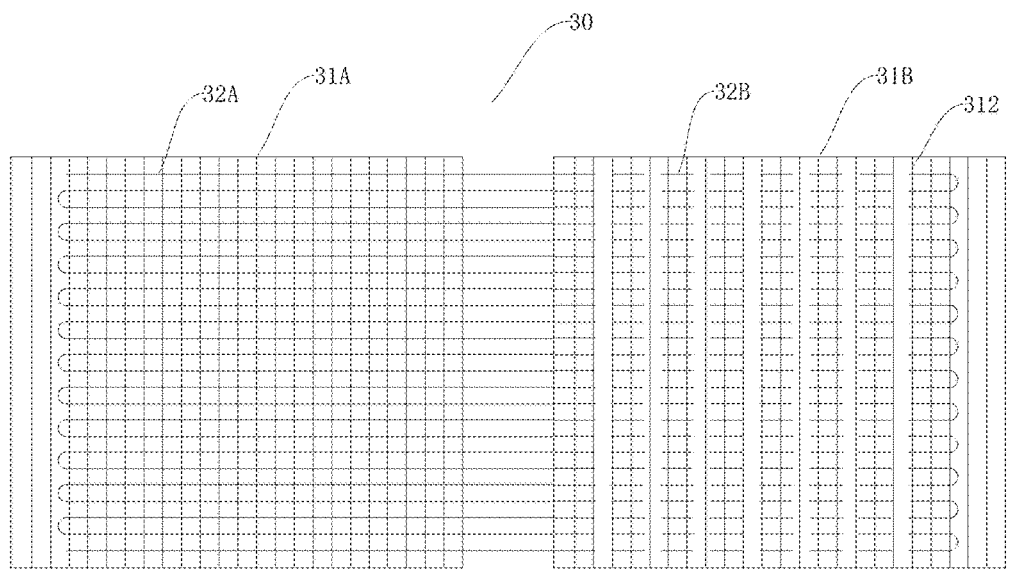
FIG. 1 is a plan view of a solar cell array according to an embodiment of the present disclosure.

REFERENCE NUMERALS 100 cell module
10 upper cover plate
20 front adhesive layer
30 cell array
31 cell
31A first cell
31B second cell
311 cell substrate
312 secondary grid line
312A front secondary grid line
312B back secondary grid line
3121 edge secondary grid line
3122 middle secondary grid line
3123 welding portion
313 back electric field
314 back electrode
32 conductive wire
32A front conductive wire
32B back conductive wire
321 metal wire body
322 welding layer
33 short grid line
40 back adhesive layer
50 lower cover plate

DETAILED DESCRIPTION

Embodiments of the present disclosure will be described in detail and examples of the embodiments will be illustrated in the drawings, where same or similar reference numerals are used to indicate same or similar members or members with same or similar functions. The embodiments described herein with reference to the drawings are explanatory, which are used to illustrate the present disclosure, but shall not be construed to limit the present disclosure.

In prior art, the front surface of the solar cell is usually provided with the primary grid lines and the secondary grid lines to output the current generated by the photoelectric effect or chemistry effect. In order to improve the efficiency of the solar cells, solar cell manufacturers conducted extensive researches on how to increase the number of the primary grid lines. In prior art, the number of primary grid lines has been successfully increased from two to three, or even five.

However, in prior art, the primary grid lines are formed by printing the paste containing expensive silver, so the manufacturing cost is very high, and the increase of the silver primary grid lines absolutely causes an increase in cost. Moreover, the current silver primary grid line has a great width (for example, up to over 2 mm), such that the increase of the silver primary grid lines will enlarge the shaded area, and make the photoelectric conversion efficiency low.

Consequently, in order to lower the cost and reduce the shaded area, in prior art, the silver primary grid lines printed on the cells are replaced with metal wires, such as copper wires which serve as the primary grid lines to output the current. Since the silver primary grid lines are no longer used, the cost can be reduced considerably; the diameter of the copper wire is relatively small, so the shaded area can be decreased. Thus, the number of the primary grid lines can be further increased up to 10. This kind of cell may be called a cell with multiple primary grid lines, in which the metal wire replaces the silver primary grid lines and welding strips in the traditional solar cell.

After extensive research, the inventor of the present disclosure finds if a cell is manufacture in a way that multiple parallel metal wires are drawn simultaneously, cut off, and then welded to the cell simultaneously, due to limitations of sophistication of equipment and process, for example, the influence of stress, the solar cell is bent to some extent when disposed at a free state, so the metal wire needs to remain strained to flatten the cell (a test proves that the minimum strain is at least 2 N for a copper wire with a diameter of 0.2 mm). In order to keep the strain, each metal wire needs to be provided with clips or similar equipment at the two ends thereof, and the equipment occupies certain space, but the space in the cell is limited. Thus, in prior art, at most ten metal wires can be drawn, fixed and welded to a single cell, and it will be difficult to increase the number of the metal wires. The larger the number of the metal wires is, the more free ends there are, such that the equipment needs to control more metal wires at the same time, which is demanding as for the wiredrawing equipment. Moreover, the space of the solar cells is limited. For example, the dimension of a single cell is 156 mm×156 mm. In such limited space, the multiple metal wires need to be controlled accurately at the same time, which is demanding as for the equipment, especially as for the accuracy. Currently, it is still difficult to control and weld multiple metal wires simultaneously in actual production, so the number of the conductive wires is limited, usually at most about ten, which is difficult to realize.

In order to solve the above problem, relevant patents (US20100275976 and US20100043863) provide a technical solution that multiple metal wires are fixed on a transparent film. That's to say, multiple parallel metal wires are fixed on the transparent film by adhesion; then, the transparent film bound with the multiple parallel metal wires is attached to the cell; finally the metal wires contact with the secondary grid lines on the cell by lamination. By this method, the multiple metal wires are fixed via the transparent film, which solves the problem of controlling the multiple metal wires simultaneously, and further increases the number of the metal wires. However, the technical solution almost abandons the welding process. That's to say, the metal wires are not connected with the secondary grid lines by the welding process; instead, the metal wires contact with the secondary grid lines by the laminating process, so as to output the current.

The above technical solution can further increase the number of the metal wires, but the transparent film may affect the light absorption, which causes certain degree of shading, and thus lowers the photoelectric conversion efficiency.

Furthermore, the above technical solution cannot connect the metal wires with the secondary grid lines by the welding process, because the melting temperature of the transparent film must be higher than the welding temperature (usually around 140° C.). Otherwise the transparent film will melt in the process of welding, which may lose the function of fixing the metal wires, and then the metal wires drift, resulting in poor welding effects.

Moreover, it is known to those skilled in the art that the solar cells in use are sealed to prevent moisture and air from penetrating the cells, which may cause corrosion and short circuits. The encapsulating material at present is EVA whose melting point is 70° C. to 80° C., much lower than the welding temperature. If the welding process is employed, as said above, the melting temperature of the transparent film must be higher than the welding temperature, which is higher than the melting point of the encapsulating material. Thus, in the encapsulating process, the encapsulating material (EVA) will melt at the encapsulating temperature, but the transparent film will not, such that the melting encapsulating material cannot penetrate the solid transparent film to completely seal the cells. Hence, the sealing effect is poor, and the actual product tends to fail. In terms of encapsulating, the melting temperature of the transparent film needs to be lower than the welding temperature, which is an evident paradox.

Therefore, the technical solution of fixing the metal wires via the transparent film cannot adopt the welding process to weld the metal wires with the secondary grid lines. The metal wires are merely in contact with the secondary grid lines on the cells, i.e. the metal wires are only placed on the secondary grid lines. Thus, the connection strength of the metal wires and the secondary grid lines is so low that the metal wires tend to separate from the secondary grid lines in the laminating process or in use, which causes bad contact, low efficiency of the cells, or even failure thereof. Consequently, the product in this technical solution is not promoted and commercialized. There is no relatively mature solar cell without primary grid lines.

Moreover, in solar cells without primary grid lines, part of the metal wire extends beyond the cell needs to be connected with other cells or loads, and the extending metal wire is under stress in the process of being employed or transferred, such as crash, shaking, etc. Part of the metal wire located at the edge of the cell tends to be detached from the secondary grid line due to external force, which causes bad contact, and hence lowers the efficiency of the cell or even failure. More specifically, the metal wire is relatively fine, and it has great contract stress therein, which make the metal wire detached from the edge secondary grid lines. The detachment of the edge secondary grid line will affect that of the middle secondary grid line. The peeling strength which the connection portion at the edge is subject to is much greater than that which the internal connection portion is subject to, and secondary grid lines at the edge will have instable connection.

The present disclosure seeks to solve at least one of the problems existing in the related art to at least some extent.

The solar cell with multiple primary grid lines provided in the present disclosure can be commercialized for mass production, and easy to manufacture with simple equipment, especially in low cost.

Thus, the present disclosure provides a solar cell unit that is easy to manufacture in low cost, and improves the photoelectric conversion efficiency.

The present disclosure further provides a solar cell array that is easy to manufacture in low cost, and improves the photoelectric conversion efficiency.

The present disclosure further provides a solar cell module with the above solar cell array, and the solar cell module is easy to manufacture in low cost, and improves the photoelectric conversion efficiency.

The present disclosure further provides a method for manufacturing the solar cell module.

Through extensive research, the inventors of the present disclosure finds that when the metal wire is welded with the secondary grid lines on the cell substrate, there is great stress because the metal wire is too thin, such that the welding between the metal wire and the secondary grid lines is not solid. The metal wire may crack and fall in less than one month, and hence the cell can no longer be used. Moreover, the secondary grid lines involve the issue of shaded surface, which may affect the light absorption rate. Therefore, the development of the technology is hindered.

According to a first aspect of embodiments of the present disclosure, a solar cell unit includes a cell comprising a cell substrate and a plurality of secondary grid lines disposed on a front surface of the cell substrate, in which the secondary grid lines comprise an edge secondary grid line adjacent to an edge of the cell substrate and a middle secondary grid line located inside of the edge secondary grid line, the secondary grid line being provided with a welding portion, at least one welding portion of the edge secondary grid line having a projection area in the cell substrate larger than a welding portion of the middle secondary grid line; a plurality of conductive wires spaced apart from each other, the plurality of conductive wires intersected and welded with the secondary grid lines in the welding portion.

As for the solar cell unit according to embodiments of the present disclosure, the secondary grid line is provided with a welding portion, and the welding portion of the edge secondary grid line is configured to have an area larger than the welding portion of the middle secondary grid line, so as to improve the connection strength of the edge secondary grid line and the conductive wire, and enlarge the connection area with the conductive wire to facilitate connecting the conductive wire with the edge secondary grid line.

According to a second aspect of embodiments of the present disclosure, a solar cell array includes a plurality of solar cell units which are the solar cell units according to the above embodiments, and cells of the adjacent cell units are connected by the conductive wires.

According to a third aspect of embodiments of the present disclosure, a solar cell module includes an upper cover plate, a front adhesive layer, a cell array, a back adhesive layer and a back plate superposed in sequence, the cell array being a solar cell array according to the above embodiments.

According to a fourth aspect of embodiments of the present disclosure, a method for manufacturing a solar cell module includes: providing a cell which includes a cell substrate and a plurality of secondary grid lines disposed on a front surface of the cell substrate, the secondary grid lines consisting of an edge secondary grid line adjacent to an edge of the cell substrate and a middle secondary grid line located inside of the edge secondary grid line, the secondary grid line being provided with a welding portion, at least one welding portion of the edge secondary grid line having a projection area in the cell larger than a welding portion of the middle secondary grid line; connecting conductive wires constituted by a metal wire with the secondary grid lines in the welding portion to obtain a solar cell unit; superposing an upper cover plate, a front adhesive layer, the solar cell unit, a back adhesive layer and a back plate in sequence, in which a front surface of the solar cell unit faces the front adhesive layer, a back surface thereof facing the back adhesive layer, and laminating them to obtain the solar cell module.

Part of technical terms in the present disclosure will be elaborated herein for clarity and convenience of description.

According to one embodiment of the present disclosure, referring to FIGS. 1-12, a cell unit includes a cell 31 and conductive wires 32, so the conductive wires 32 can be called the conductive wires 32 of the cell unit.

Cell 31 includes a cell substrate 311, a secondary grid line 312 disposed on a front surface (the surface on which light is incident) of the cell substrate 311, a back electric field 313 disposed on a back surface of the cell substrate 311, and a back electrode 314 disposed on the back electric field 313. Thus, the secondary grid line 312 can be called the secondary grid line 312 of the cell 31, the back electric field 313 called the back electric field 313 of the cell 31, and the back electrode 314 called the back electrode 314 of the cell 31.

The cell substrate 311 can be an intermediate product obtained by subjecting, for example, a silicon chip to processes of felting, diffusing, edge etching and silicon nitride layer depositing. However, it shall be understood that the cell substrate 311 in the present disclosure is not limited to be formed by the silicon chip.

In other words, the cell 31 comprises a silicon chip, some processing layers on a surface of the silicon chip, a secondary grid line on a front surface, and a back electric field 313 and a back electrode 314 on a back surface, or includes other equivalent solar cells of other types without any front electrode.

The cell unit, the cell 31 and the cell substrate 311 are used to illustrate the present disclosure, but shall not be construed to limit the present disclosure.

A solar cell array 30 is arranged by a plurality of cells, i.e. by a plurality of cells 31 connected by a conductive wire 32.

In the solar cell array 30, a metal wire S constitutes the conductive wire 32 of the cell, and extends between surfaces of the adjacent cells 31, which shall be understood in a broad sense that the metal wire S may extend between surfaces of the adjacent cells 31, or may be connected with a secondary grid line 312 of the cell 31, or may be connected with a secondary grid line 312 of a first cell 31 and a back electrode 314 of a second cell 31 adjacent to the first cell 31, or a part of the metal wire S is connected with the secondary grid line 312 and the other part of the metal wire S is connected with a back electrode 314 of the cell 31.

That's to say, the metal wire S can extend between front surfaces of adjacent cells 31, or extend between a front surface of a first cell 31 and a back surface of a second cell 31 adjacent to the first cell 31. When the metal wire S extends between the front surface of the first cell 31 and the back surface of the second cell 31 adjacent to the first cell 31, the conductive wire 32 may include a front conductive wire 32A extending on the front surface of the cell 31 and electrically connected with the secondary grid lien 312 of the cell 31, and a back conductive wire 32B extending on the back surface of the cell 31 and electrically connected with the back electrode 314 of the cell 31. Part of the metal wire S between the adjacent cells 31 can be called a connection conductive wire.

All the ranges disclosed in the present disclosure include endpoints, and can be individual or combined. It shall be understood that the terminals and any value of the ranges are not limited to an accurate range or value, but also include values proximate the ranges or values.

In the present disclosure, the orientation terms such as "upper" and "lower" usually refer to the orientation "upper" or "lower" as shown in the drawings under discussion, unless specified otherwise; "front surface" refers to a surface of the solar cell module facing the light when the module is in operation, i.e. a surface on which light is incident, while "back surface" refers to a surface of the solar cell module back to the light when the module is in operation.

In the following, the solar cell unit will be described according to the embodiments of the present disclosure.

As shown in FIG. 1 to FIG. 13, the solar cell unit according to the embodiments of the present disclosure includes a cell 31 and conductive wires 32. The cell 31 includes a cell substrate 311 and a plurality of secondary grid lines 312 disposed on a front surface of the cell substrate 311. The secondary grid lines 312 comprise an edge secondary grid line 3121 adjacent to an edge of the cell substrate 311 and a middle secondary grid line 3122 located inside of the edge secondary grid line 3121. The secondary grid line 312 is provided with a welding portion 3123, and at least one welding portion 3123 of the edge secondary grid line 3121 has a projection area in the cell substrate 311 larger than a welding portion 3123 of the middle secondary grid line 3122. A plurality of conductive wires 32 are spaced apart from each other, and are intersected and connected with the secondary grid lines 312.

In other words, the solar cell unit according to the present disclosure is mainly formed with the cell 31 and conductive wires 32; the cell 31 is mainly constituted by the cell substrate 311 and secondary grid lines 312. In the present disclosure, the secondary grid lines 312 disposed on the front surface of the cell substrate 311 will be described in detail.

The secondary grid lines 312 include edge secondary grid lines 3121 and middle secondary grid lines 3122. The edge secondary grid lines 3121 are close to the edges of left and right sides of the cell substrate 311, while the middle secondary grid lines 3122 are disposed between the edge secondary grid lines 3121 at both sides of the cell substrate 311. Each secondary grid line 312 is provided with a welding portion 3123. The welding portion 3123 of at least one edge secondary grid line 3121 has a larger area than a welding portion 3123 of the middle secondary grid line 3122.

Moreover, in the present disclosure, a welding portion 3123 on at least one edge secondary grid line 3121 has a larger area than a welding portion 3123 on the middle secondary grid line 3122, which can be understood that all the welding portions 3123 on one edge secondary grid line 3121 have a larger area than the welding portions 3123 on the middle secondary grid line 3122, or part of the welding portions 3123 on the edge secondary grid line 3121 have a larger area than the welding portions 3123 on the middle secondary grid line 3122, i.e. the welding portions 3123 on the edge secondary grid line 3121 may partially or totally enlarge the area.

It shall be noted that in the current printed cells, the width of the secondary grid lines both at the edges and in the middle of the cell substrate is equal, but as for the cell in the present disclosure, the conductive wires are welded with the secondary grid lines, and need to be connected with other cells or loads. The extending part of the conductive wires is subject to an external force, especially when two cells are connected by the conductive wires in the technical solution of the present disclosure. The conductive wires are welded with two metal sheets, such that there is stress between them. More specifically, the conductive wires of the present disclosure are made of a metal wire which is fine and hence has a relatively greater strain stress, such that the conductive wires tend to be peeled with the edge secondary grid lines, and the peeling of the edge secondary grid lines may affect the middle grid lines. The connection portion at the edges is subject to much greater peeling force compared with the internal portions, such that the secondary grid lines at the edges tend to be connected unstably.

In addition, regarding the conductive wires constituted by a single wire which winds reciprocally, the conductive wires at the edges are not formed as straight lines, but in circular arcs, U-shape or other bended shape, which results in greater stress. The distance between the ends of each conductive wire and the secondary grid lines at the edges of the cell has a certain bias. The connection position of the secondary grid lines at the edges of the cells and the conductive wires is uncertain, which may make the connection unstable.

In the solar cell unit according to the embodiments of the present disclosure, the secondary grid lines 312 are divided into edge secondary grid lines 3121 and middle secondary grid lines 3122, and the welding portion 3123 of at least one edge secondary grid line 3121 has an area larger than a welding portion 3123 of the middle secondary grid line 3122, so as to improve the connection strength of the conductive wires 32 and the edge secondary grid lines 3121, and enlarge the connection area with the conductive wires 32 to facilitate connecting the conductive wires 32 with the edge secondary grid lines 3121 and to lower instability.

Thus, in the solar cell unit according to the embodiments of the present disclosure, the edge secondary grid line 3121 is configured to have a width greater than that of the middle secondary grid line 3122, so as to improve the connection strength of the edge secondary grid lines 3121 and the conductive wires 32, and enlarge the connection area with the conductive wires 32 to facilitate connecting the conductive wires 32 with the edge secondary grid lines 3121. According to an embodiment of the present disclosure, the welding portion on the edge secondary grid line has a projection area of 0.1-1.2 $mm^2$, and the welding portion on the middle secondary grid line has a width of 0.01-0.2 $mm^2$.

According to an embodiment of the present disclosure, a welding portion 3123 of the edge secondary grid line 3121 has a width in a direction orthogonal to the secondary grid line 312 greater than a welding portion 3123 of the middle secondary grid line 3122.

Figure 13:
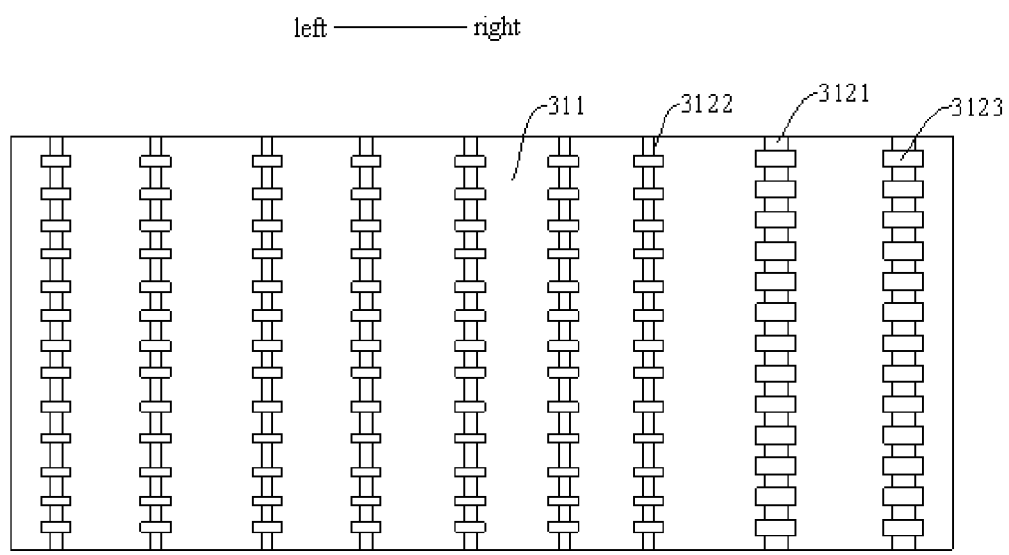
FIG. 13 is a schematic diagram of a secondary grid line of a solar cell unit according to an embodiment of the present disclosure.

That's to say, as shown in FIG. 13, the secondary grid lines 312 are broaden in a position where the secondary grid lines 312 are intersected with the conductive wires 32, and the part of the secondary grid lines 312 is taken as a welding portion 3123 to be welded with the conductive wires 32. The welding portion 3123 of the secondary grid lines 312 is broaden to facilitate welding the secondary grid lines 312 with the conductive wires 32. Meanwhile, other parts of the secondary grid lines 312 remain the original width, or even reduced width, which not only can guarantee the welding effect of the secondary grid lines 312 and the conductive wires 32, but also can reduce the shaded area.

Specifically, the welding portion 3123 of the edge secondary grid line 3121 is broader than the welding portion 3123 of the middle secondary grid line 3122. Consequently, as for the solar cell unit according to the embodiments of the present disclosure, the portion where the secondary grid lines 312 are welded with the conductive wires 32 is widened, and the portion where the edge secondary grid lines 3121 are welded with the conductive wires 32 is much broader, so as to facilitate welding the conductive wires 32 with the edge secondary grid lines 3121, and improve the welding strength.

Alternatively, according to an embodiment of the present disclosure, the welding portion 3123 of the edge secondary grid line 3121 has a width of 0.08 to 0.6 mm. Preferably, the welding portion 3123 of the edge secondary grid line 3121 has a width of 0.15 to 0.3 mm. Thus, the welding portion 3123 in such a size and the conductive wire 32 have a larger welding area with greater welding strength.

In some embodiments of the present disclosure, the width of a part of the edge secondary grid line 3121 between the adjacent welding portions 3123 is equal to that of a part of the middle secondary grid line 3122 between the adjacent welding portions 3123. Alternatively, the part of the edge secondary grid line 3121 between the adjacent welding portions 3123 has a width of 0.15 to 0.3 mm.

That's to say, the secondary grid lines 312 comprises the edge secondary grid lines 3121 and the middle secondary grid lines 3122, in which the width of other parts of the edge secondary grid lines 3121 except the welding portion 3123 is equal to that of other part of the middle secondary grid lines 3122 except the welding portion 3123.

Therefore, the width of other parts of the edge secondary grid lines 3121 except the welding portion 3123 is configured to be equal to that of other part of the middle secondary grid lines 3122 except the welding portion 3123, so as to reduce the shaded area to guarantee the photoelectric conversion efficiency, and to save the materials for manufacturing the secondary grid lines 312 to lower the cost.

In the practical manufacturing process, the metal wire has straight portions and deformed portions due to winding reciprocally, and the deformed portions (i.e. being bended) will gradually deviate from the original direction of the straight line. Thus, in order to weld the bended deformed portions of the metal wire and the edge secondary grid lines, and to prevent the metal wire from deviating from the welding portion 3123 due to deformation, preferably, the welding portion 3123 of the edge secondary grid line 3121 has a length larger than a part of the edge secondary grid line 3121 between the adjacent welding portions 3123. Further, a ratio between a length of the welding portion 3123 of the edge secondary grid line 3121 and a length of a part of the edge secondary grid line 3121 between the adjacent welding portions 3123 is (1.05-1.3):1.

In other words, the welding portion 3123 of the edge secondary grid line 3121 is longer than the non-welding area, such that the welding portion 3123 has a larger welding area with the conductive wire 32, and the welding strength is improved.

In some embodiments of the present disclosure, the edge secondary grid lines 3121 are secondary grid lines 312 adjacent to a side of the cell substrate 311.

Alternatively, according to an embodiment of the present disclosure, the edge secondary grid lines 3121 adjacent to each side of the cell substrate 311 are the first to the fifth secondary grid lines 312 from the outmost side. Preferably, the edge secondary grid lines 3121 adjacent to each side of the cell substrate 311 are the first to the fourth secondary grid lines 312 from the outmost side. Further, the edge secondary grid lines 3121 adjacent to each side of the cell substrate 311 are the first to the third secondary grid lines 312 from the outmost side. Most preferably, the edge secondary grid lines 3121 adjacent to each side of the cell substrate 311 are the first to the second secondary grid lines 312 from the outmost side.

It can be understood that the edge secondary grid lines 3121 may be all the secondary grid lines 312 adjacent to one side of the cell substrate 311, or may be part of the secondary grid lines 312, i.e. part of the edge secondary grid lines 3121 having a broadened width, yet the other part of the edge secondary grid lines 3121 having the same width as the middle secondary grid lines 3122. Preferably, one edge secondary grid line 3121 closest to the cell substrate 311 is broadened, but other edge secondary grid lines 3121 remain the same width as the middle secondary grid lines 3122.

In addition, the welding portions 3123 on the edge secondary grid lines 3121 each can be widened, or can be spaced apart for widening, or the welding portions 3121 on the adjacent edge secondary grid lines 3121 are spaced apart for widening.

As shown in FIG. 13, in the embodiment, the secondary grid lines 312 at the left side of the cell substrate 311 are the edge secondary grid lines 3121. The number of the secondary grid lines 312 for constituting the edge secondary grid lines 3121 is determined by the position where the conductive wires 32 are widened.

That's to say, the edge secondary grid lines 3121 are disposed adjacent to one side of the cell substrate 311, and the specific position can be adjusted based on the mounting position of the cell substrate 311 and the welding position of the conductive wires. As for the secondary grid lines 312 at the left side, from left to right, the first secondary grid line 312 and the second secondary grid line 312 form the edge secondary grid lines 3121 at the left side; as for the secondary grid lines 312 at the right side, from right to left, the first secondary grid line 312 and the second secondary grid line 312 form the edge secondary grid lines 3121 at the right side.

Preferably, in some embodiments of the present disclosure, the edge secondary grid lines 3121 have a width larger than the middle secondary grid lines 3122. Specifically, the edge secondary grid line 3121 has a width of 0.025 to 0.3 mm, and the middle secondary grid line 3122 has a width of 0.015 to 0.15 mm.

That's to say, in the present disclosure, all the edge secondary grid lines 3121 are broader than the middle secondary grid lines 3122, so as to guarantee the connection strength of the edge secondary grid lines 3121 and the conductive wires 32, and enlarge the welding area with the conductive wires 32.

In the following, the solar cell array 30 will be described according to the embodiments of the present disclosure.

According to the embodiments of the present disclosure, the solar cell array 30 includes a plurality of solar cell units which are the solar cell units according to the above embodiment, cells 31 of adjacent cell units being connected by the conductive wires 32.

Since the solar cell unit according to the above embodiment of the present disclosure has the above technical effect, the solar cell array 30 according to the embodiment of the present disclosure has the corresponding technical effect, i.e. improving the connection strength of the edge secondary grid lines 3121 and the conductive wires 32, and enlarging the connection area with the conductive wires 32 to facilitate connecting the conductive wires 32 with the edge secondary grid lines 3121.

Specifically, in some embodiments of the present disclosure, the conductive wires are constituted by the metal wire S which extends reciprocally between a surface of a first cell 31 and a surface of a second cell 31 adjacent to the first cell 31.

The cell unit is formed by the cell 31 and the conductive wires 32 constituted by the metal wire S which extends on the surface of the cell 31. In other words, the solar cell array 30 according to the embodiments of the present disclosure is formed with a plurality of cell units; the conductive wires 32 of the plurality of cells are formed by the metal wire body 321 which extends reciprocally between the surfaces of the cells 31.

It shall be understood that the term "extending reciprocally" in this disclosure can be called "winding" which means that the metal wire S extends between the surfaces of the cells 31. For example, referring to FIG. 1, in some circumstances, the metal wire extends between the surfaces of the cells 31 in the same plane, such as either between the front surfaces or between the bottom surfaces of the cells, to form a serpentine pattern. In some other circumstances, the metal wire S extends between the surfaces of the cells 31 in multiple planes, such as between both the front surface of a cell and the bottom surface of an adjacent cell, to form a serpentine pattern. In yet other circumstances, the metal wire S extends between the surfaces of the cells 31 both in the same plane and in multiple planes, such as sometimes between either the front surfaces or the bottom surfaces of some adjacent cells, and at other times between both the front surface of a certain cell and the bottom surface of an adjacent cell, to form a serpentine pattern. The plurality of conductive wires equals two or more passes of the serpentine shaped pattern. Preferably, two or more passes of the serpentine shaped pattern on the same plane are substantially parallel to each other. More preferably, all the passes of the serpentine shaped pattern on the same plane are substantially parallel to each other.

In the present disclosure, it shall be understood in a broad sense that "the metal wire S extends reciprocally between a surface of a first cell 31 and a surface of a second cell 31 adjacent to the first cell 31. For example, the metal wire S may extend reciprocally between a front surface of a first cell 31 and a back surface of a second cell 31 adjacent to the first cell 31; the metal wire S may extend from a surface of the first cell 31 through surfaces of a predetermined number of middle cells 31 to a surface of the last cell 31, and then extends back from the surface of the last cell 31 through the surfaces of a predetermined number of middle cells 31 to the surface of the first cell 31, extending reciprocally like this.

In addition, when the cells 31 are connected in parallel by the metal wire S, the metal wire S can extend on front surfaces of the cells, such that the metal wire S constitutes front conductive wires 32A of the cells. Alternatively, a first metal wire S extends reciprocally on a front surface of a cell 31, and a second metal wire S extends reciprocally on a back surface of the cell 31, such that the first metal wire S constitutes a front conductive wire 32A, and the second metal wire S constitutes a back conductive wire 32B.

When the cells 31 are connected in series by the metal wire S, the metal wire S can extend reciprocally between a front surface of a first cell 31 and a back surface of a second cell 31 adjacent to the first cell 31, such that part of the metal wire S which extends on the front surface of the first cell 31 constitutes a front conductive wire 32A, and part thereof which extends on the back surface of the second cell 31 constitutes a back conductive wire 32B. In the present disclosure, unless specified otherwise, the conductive wire 32 can be understood as the front conductive wire 32A, the back conductive wire 32B, or the combination thereof.

The term "extending reciprocally" can be understood as that the metal wire body 321 extends reciprocally once to form two conductive wires 32 which form a U-shape or V-shape structure by the metal wire body 321 extending reciprocally, yet the present disclosure is not limited to the above.

In the solar cell array 30 according to the embodiments of the present disclosure, a plurality of conductive wires 32 of the cell units are constituted by the metal wire body 321 which extends reciprocally; and the adjacent cells 31 are connected by the conductive wires 32. Hence, the conductive wires 32 of the cell units in the present disclosure are used to output the current, and are not necessarily printed by expensive silver paste, and can be manufactured in a simple manner without using a solder strip to connect the cells. It is easy and convenient to connect the metal wire body 321 with the secondary grid line and the back electrode, so that the cost of the cells is reduced considerably.

Moreover, since the conductive wires 32 are constituted by the metal wire body 321 which extends reciprocally, the width of the conductive wires 32 (i.e. the width of projection of the metal wire on the cell) is much smaller than that of the current primary grid lines printed by silver paste, thereby decreasing the shaded area. Further, the number of the conductive wires 32 can be adjusted easily, and thus the resistance of the conductive wires 32 is reduced, compared with the conductive wires made of the silver paste, and the efficiency of photoelectric conversion is improved. Since the metal wire body 321 extends reciprocally to form the conductive wires, when the cell array 30 is used to manufacture the solar cell module 100, the metal wire body 321 is easier to control accurately and will not tend to shift, i.e. the metal wire is not easy to "drift", which will not affect but further improve the photoelectric conversion efficiency.

Therefore, the solar cell array 30 according to the embodiments of the present disclosure has low cost and high photoelectric conversion efficiency.

In the following, the solar cell array 30 according to specific embodiments of the present disclosure will be described with reference to the drawings.

The solar cell array 30 according to a specific embodiment of the present disclosure is illustrated with reference to FIG. 1 to FIG. 3.

Figure 2:
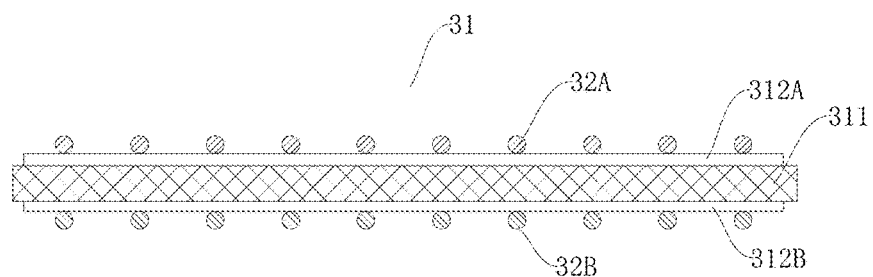
FIG. 2 is a longitudinal sectional view of a solar cell array according to an embodiment of the present disclosure.
Figure 3:
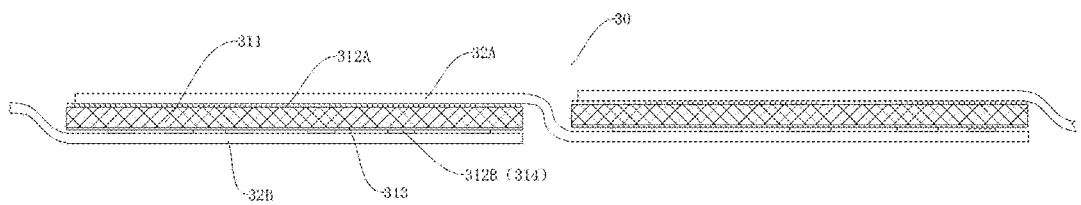
FIG. 3 is a transverse sectional view of a solar cell array according to embodiments of the present disclosure.

In the embodiment shown in FIG. 1 to FIG. 3, two cells in the solar cell array 30 are shown. In other words, it shows two cells bodies 31 connected with each other via the conductive wire 32 constituted by the metal wire S.

It can be understood that the cell 31 comprises a cell substrate 311, a secondary grid line 312 (a front secondary grid line 312A) disposed on a front surface of the cell substrate 311, a back electric field 313 disposed on a back surface of the cell substrate 311, and a back electrode 314 disposed on the back electric field 313. In the present disclosure, it can be understood that the back electrode 314 may be a back electrode of a traditional cell, for example, printed by the silver paste, or may be a back secondary grid line 312B similar to the secondary grid line on the front surface of the cell substrate, or may be multiple discrete welding portions, unless specified otherwise. The secondary grid line refers to the secondary grid line 312 on the front surface of the cell substrate 311, unless specified otherwise.

When a plurality of solar cell units are connected to form the solar cell array 30, in the secondary grid lines 312 of two adjacent cells, the metal wire extends reciprocally on two adjacent cells, and bends at the sides of the two cells remote from each other. Since the deformation stress of the metal wire is relatively great at the arc turns, the secondary grid lines at the turns need to be broadened.

That's to say, when two cells are connected by the conductive wires winding reciprocally, the edge secondary grid lines at the outer edge of the cell need to be widened, i.e. in two cells as a whole, widening the edge secondary grid lines at the outer edges thereof. When the cells are arranged in the left-to-right direction, the edge secondary grid lines at the left side of the left cell are broadened, and the edge secondary grid lines at the right side of the right cell are broadened.

Specifically, in an embodiment of the present disclosure, the metal wire extends reciprocally between a front surface of a first cell 31 and a back surface of a second cell 31.

As shown in FIG. 1 to FIG. 3, the solar cell array in the embodiment includes two cells 31A, 31B (called a first cell 31A and a second cell 31B respectively for convenience of description). The metal wire S extends reciprocally between the front surface of the first cell 31A (a front surface, i.e. an upper surface in FIG. 2) and the back surface of the second cell 31B, such that the metal wire S constitutes a front conductive wire of the first cell 31A and a back conductive wire of the second cell 31B. The metal wire S is electrically connected with the secondary grid line of the first cell 31A, and electrically connected with the back electrode of the second cell 31B.

Specifically, in the two adjacent cells, the first cell 31A and the second cell 31B each include a cell substrate 311 and secondary grid lines 312 disposed at the front surface of the cell substrate 311. The metal wire extends reciprocally between the front surface of the first cell 31A and the back surface of the second cell 31B.

In the secondary grid lines 312 of the cell substrate 311 of the first cell 31A, the secondary grid lines 312 remote from one side of the second cell 31B form the edge secondary grid lines 3121 which have a width greater than other secondary grid lines 312, and the conductive wires bend at the position, so as to guarantee the welding strength, when the conductive wires 32 are connected with the edge secondary grid lines 3121 at the position. The edge secondary grid lines 3121 at other positions have the same width as the middle secondary grid lines 3122, so as to avoid enlarging the shaded area, and to guarantee the photoelectric conversion efficiency.

In an embodiment of the present disclosure, back electrodes 314 are disposed on the back surface of the cell substrate 311, and the metal wire is welded with the back electrodes 314.

That's to say, in the embodiment, front secondary grid lines 312A are disposed on the front surface of the cell substrate 311, and back electrodes 314 are disposed on the back surface thereof. When the conductive wires 32 are located on the front surface of the cell substrate 311, the conductive wires 32 are welded with the front secondary grid lines 312A; when the conductive wires 32 are located on the back surface of the cell substrate 311, the conductive wires 32 are welded with the back electrodes 314 on the back surface of the cell substrate 311.

In some embodiments, there is a metal wire S. The metal wire S extends reciprocally between the first cell 31A and the second cell 31B for 10 to 60 times. Preferably, as shown in FIG. 1, the metal wire extends reciprocally for 12 times to form 24 conductive wires, and there is only one metal wire. In other words, a single metal wire extends reciprocally for 12 times to form 24 conductive wires, and the distance of the adjacent conductive wires can range from 2.5 mm to 15 mm. In this embodiment, the number of the conductive wires is increased, compared with the traditional cell, such that the distance between the secondary grid line and the conductive wire which the current runs through is decreased, so as to reduce the resistance and improve the photoelectric conversion efficiency. In the embodiment shown in FIG. 1, the adjacent conductive wires form a U-shape structure, for convenience of winding the metal wire. Alternatively, the present disclosure is not limited to the above. For example, the adjacent conductive wires may form a V-shape structure.

In some embodiments, preferably, the metal wire body 321 is a copper wire, yet the present disclosure is not limited thereto. For example, the metal wire body 321 may be an aluminum wire. Preferably, the metal wire body 321 has a circular cross section, such that more sunlight can reach the cell substrate to further improve the photoelectric conversion efficiency.

Figure 4:
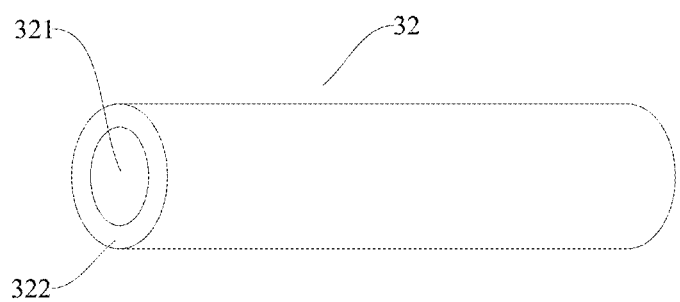
FIG. 4 is a schematic diagram of a metal wire for forming a conductive wire according to embodiments of the present disclosure.

More preferably, as shown in FIG. 4, the metal wire body 321 is coated with a welding layer 322. The metal wire is welded with the secondary grid line and/or the back electrode by the welding layer, such that it is convenient to electrically connect the metal wire with the secondary grid line and/or the back electrode, and to avoid drifting of the metal wire in the connection process so as to guarantee the photoelectric conversion efficiency. Of course, the electrical connection of the metal wire with the cell can be conducted when or before the solar cell module is laminated, and preference is given to the latter.

In some embodiments, preferably, before the metal wire contact the cell, the metal wire extends under a strain, i.e. straightening the metal wire. After the metal wire is connected with the secondary grid line and the back electrode of the cell, the strain of the metal wire can be released, so as to further avoid the drifting of the conductive wire when the solar cell module is manufacture, and to guarantee the photoelectric conversion efficiency.

Figure 5:
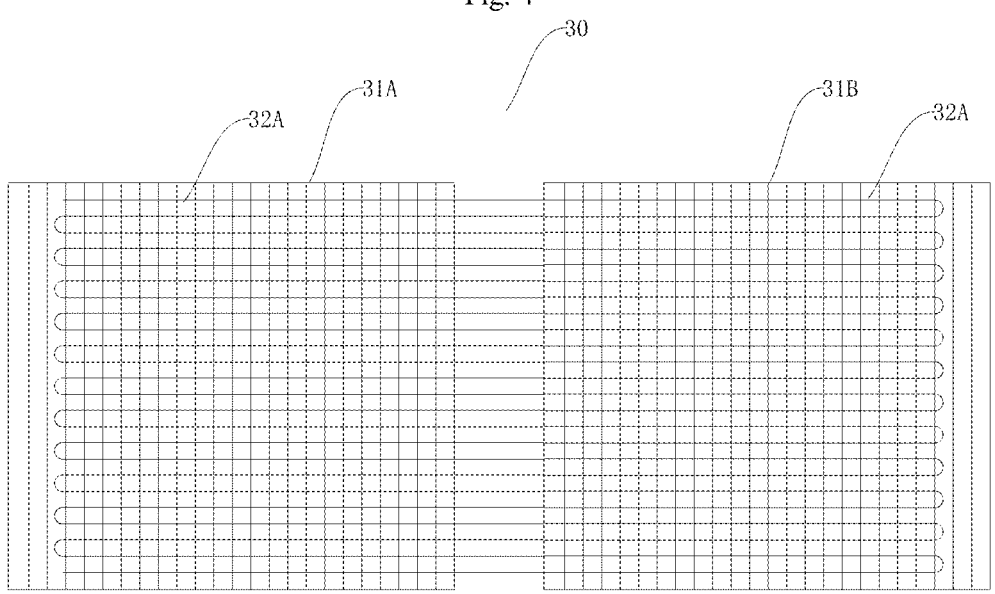
FIG. 5 is a plan view of a solar cell array according to another embodiment of the present disclosure.

FIG. 5 is a schematic diagram of a solar cell array according to another embodiment of the present disclosure. As shown in FIG. 5, the metal wire extends reciprocally between the front surface of the first cell 31A and the front surface of the second cell 31B, such that the metal wire constitutes front conductive wires of the first cell 31A and the second cell 31B. In such a way, the first cell 31A and the second cell are connected in parallel. Of course, it can be understood that preferably the back electrode of the first cell 31A and the back electrode of the second cell 31B can be connected via a back conductive wire constituted by another metal wire which extends reciprocally. Alternatively, the back electrode of the first cell 31A and the back electrode of the second cell 31B can be connected in a traditional manner.

The solar cell array 30 according to another embodiment of the present disclosure is illustrated with reference to FIG. 6.

The solar cell array 30 according to the embodiment of the present disclosure comprises n×m cells 31. In other words, a plurality of cells 31 are arranged in an n×m matrix form, n representing a column, and m representing a row. More specifically, in the embodiment, 36 cells 31 are arranges into six columns and six rows, i.e. n=m=6. It can be understood that the present disclosure is not limited thereto. For example, the column number and the row number can be different. For convenience of description, in FIG. 6, in a direction from left to right, the cells 31 in one row are called a first cell 31, a second cell 31, a third cell 31, a fourth cell 31, a fifth cell 31, and a sixth cell 31 sequentially; in a direction from up to down, the columns of the cells 31 are called a first column of cells 31, a second column of cells 31, a third column of cells 31, a fourth column of cells 31, a fifth column of cells 31, and a sixth column of cells 31 sequentially.

In a row of the cells, the metal wire extends reciprocally between a surface of a first cell 31 and a surface of a second cell 31 adjacent to the first cell 31; in two adjacent rows of cells 31, the metal wire extends reciprocally between a surface of a cell 31 in a $a^{th}$ row and a surface of a cell in a $(a+1)^{th}$ row, and $m-1 \geq a \geq 1$.

Figure 6:
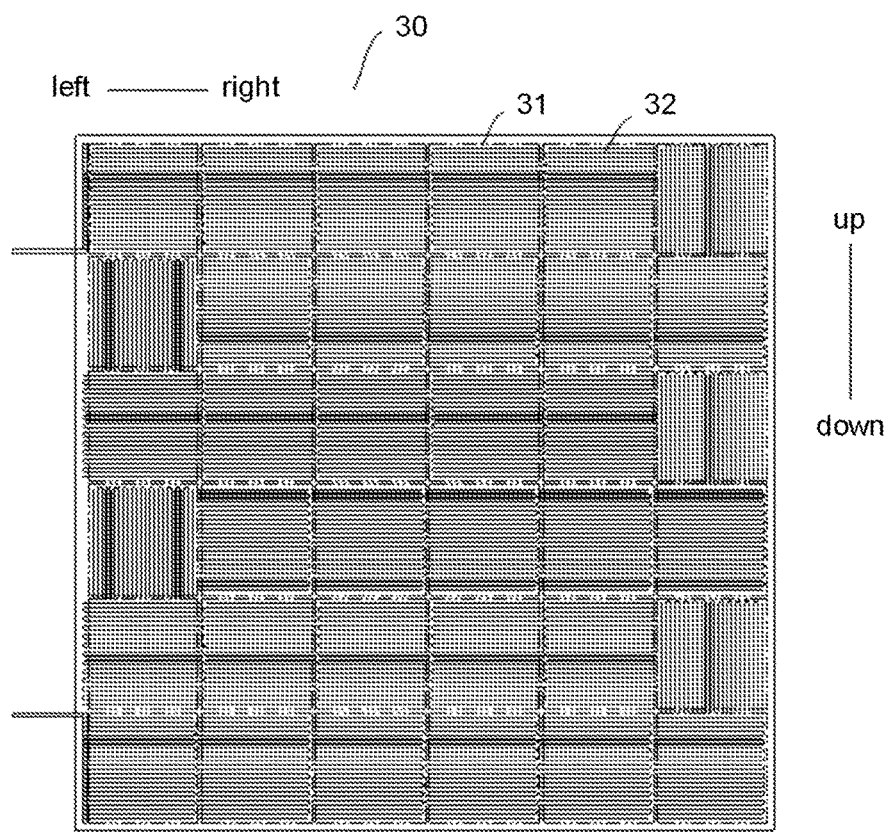
FIG. 6 is a plan view of a solar cell array according to another embodiment of the present disclosure.

As shown in FIG. 6, in a specific example, in a row of the cells 31, the metal wire extends reciprocally between a front surface of a first cell 31 and a back surface of a second cell 31 adjacent to the first cell 31, so as to connect the cells in one row in series. In two adjacent rows of cells 31, the metal wire extends reciprocally between a front surface of a cell 31 at an end of the $a^{th}$ row and a back surface of a cell 31 at an end of the $(a+1)^{th}$ row, to connect the two adjacent rows of cells 31 in series.

In the plurality of secondary grid lines 312 of multiple cells, the secondary grid lines 312 at a position where the metal wire goes across and bends at one side of the cells, form edge secondary grid lines 3121. The edge secondary grid lines 3121 are located at a position where the metal wire bends, and this part of the edge secondary grid lines 3121 is widened, but the edge secondary grid lines 3121 at the other side remain the same width as the middle secondary grid lines 3122, so as to enhance the connection strength between the conductive wires 32 and the secondary grid liens 312, and to avoid enlarging the shaded area to guarantee the photoelectric conversion efficiency. More preferably, in the two adjacent rows of cells 31, the metal wire extends reciprocally between the surface of the cell 31 at an end of the $a^{th}$ row and the surface of the cell 31 at an end of the $(a+1)^{th}$ row, the end of the $a^{th}$ row and the end of the $(a+1)^{th}$ row located at the same side of the matrix form, as shown in FIG. 6, located at the right side thereof.

More specifically, in the embodiment as shown in FIG. 6, in the first row, a first metal wire extends reciprocally between a front surface of a first cell 31 and a back surface of the second cell 31; a second metal wire extends reciprocally between a front surface of the second cell 31 and a back surface of a third cell 31; a third metal wire extends reciprocally between a front surface of the third cell 31 and a back surface of a fourth cell 31; a fourth metal wire extends reciprocally between a front surface of the fourth cell 31 and a back surface of a fifth cell 31; a fifth metal wire extends reciprocally between a front surface of the fifth cell 31 and a back surface of a sixth cell 31. In such a way, the adjacent cells 31 in the first row are connected in series by corresponding metal wires.

A sixth metal wire extends reciprocally between a front surface of the sixth cell 31 in the first row and a back surface of a sixth cell 31 in the second row, such that the first row and the second row are connected in series. A seventh metal wire extends reciprocally between a front surface of the sixth cell 31 in the second row and a back surface of a fifth cell 31 in the second row; a eighth metal wire extends reciprocally between a front surface of the fifth cell 31 in the second row and a back surface of a fourth cell 31 in the second row, until a eleventh metal wire extends reciprocally between a front surface of a second cell 31 in the second row and a back surface of a first cell 31 in the second row, and then a twelfth metal wire extends reciprocally between a front surface of the first cell 31 in the second row and a back surface of a first cell 31 in the third row, such that the second row and the third row are connected in series. Sequentially, the third row and the fourth row are connected in series, the fourth row and the fifth row connected in series, the fifth row and the sixth row connected in series, such that the cell array 30 is manufacture. In this embodiment, a bus bar is disposed at the left side of the first cell 31 in the first row and the left side of the first cell 31 in the sixth row respectively; a first bus bar is connected with a conductive wire extending from the left side of the first cell 31 in the first row, and a second bus bar is connected with a conductive wire extending from the left side of the first cell 31 in the sixth row.

As said above, the cells in the embodiments of the present disclosure are connected in series by the conductive wires—the first row, the second row, the third row, the fourth row, the fifth row and the sixth row are connected in series by the conductive wires. As shown in Figs. Alternatively, the second and third row, and the fourth and fifth rows can be connected in parallel with a diode respectively to avoid light spot effect. The diode can be connected in a manner commonly known to those skilled in the art, for example, by a bus bar.

However, the present disclosure is not limited to the above. For example, the first and second rows can be connected in series, the third and fourth rows connected in series, the fifth and sixth rows connected in series, and meanwhile the second and third rows are connected in parallel, the fourth and fifth connected in parallel. In such a case, a bus bar can be disposed at the left or right side of corresponding rows respectively.

Alternatively, the cells 31 in the same row can be connected in parallel. For example, a metal wire extends reciprocally from a front surface of a first cell 31 in a first row through the front surfaces of the cells 31 in the second row to the sixth row.

In some specific embodiments of the present disclosure, a binding force between the metal wire and the cells 31 ranges from 0.1N to 0.8N. That's to say, the binding force between the conductive wires 32 and the cells 31 ranges from 0.1N to 0.8N. Preferably, the binding force between the metal wire and the cells ranges from 0.2N to 0.6N, so as to secure the welding between the cells and the metal wire, to avoid sealing-off of the cells in the operation and the transferring process and performance degradation due to poor connection, and to lower the cost.

Preferably, there is a metal wire extending reciprocally between adjacent cells 31 in a row; and there is a metal wire extending reciprocally between cells 31 in adjacent rows. Thus, adjacent cells 31 can be connected by a single metal wire that extends reciprocally for several times, which is easier to manufacture in lower cost.

In an embodiment of the present disclosure, the metal wire is coated with a welding layer. The ratio of the thickness of the welding layer and the diameter of the metal wire is (0.02-0.5):1.

That's to say, in the cell array 30, the ratio of the thickness of the welding layer and the diameter of the conductive wire 32 (including the front conductive wire 32A and back conductive wire 32B) is (0.02-0.5):1.

In the present disclosure, the conductive wires 32 (including the front conductive wires 32A and back conductive wires 32B) consist of a metal wire and a welding layer coating the metal wire. The welding layer may coat the metal wire completely or partially. When the welding layer coats the metal wire partially, the alloy layer is, preferably, formed at a position where the welding layer is welded with the secondary grid lines 312 of the cell 31. When the welding layer coats the metal wire completely, the welding layer can coat the periphery of the metal wire in a circular manner. The thickness of the welding layer can fall into a relatively wide range. Preferably, the welding layer has a thickness of 1 to 100 μm, more preferably, 1 to 30 μm.

The alloy with a low melting point for forming the welding layer may be a conventional alloy with a low melting point which can be 100 to 220° C. Preferably, the alloy with the low melting point contains Sn, and at least one of Bi, In, Ag, Sb, Pb and Zn, more preferably, containing Sn, Bi, and at least one of In, Ag, Sb, Pb and Zn.

Specifically, the alloy may be at least one of Sn—Bi alloy, In—Sn alloy, Sn—Pb alloy, Sn—Bi—Pb alloy, Sn—Bi—Ag alloy, In—Sn—Cu alloy, Sn—Bi—Cu alloy and Sn—Bi—Zn alloy. Most preferably, the alloy is Bi—Sn—Pb alloy, for example, containing 40 weight percent of Sn, 55 weight percent of Bi, and 5 weight percent of Pb (i.e. Sn40%-Bi55%-Pb5%). The thickness of the welding layer can be 0.001 to 0.06 mm. The conductive wire 32 may have a cross section of 0.01 to 0.5 mm². The metal wire can be conventional in the art, for example, a copper wire.

The solar cell module 100 according to embodiments of the present disclosure is illustrated with reference to FIG. 10 and FIG. 11.

Figure 10:
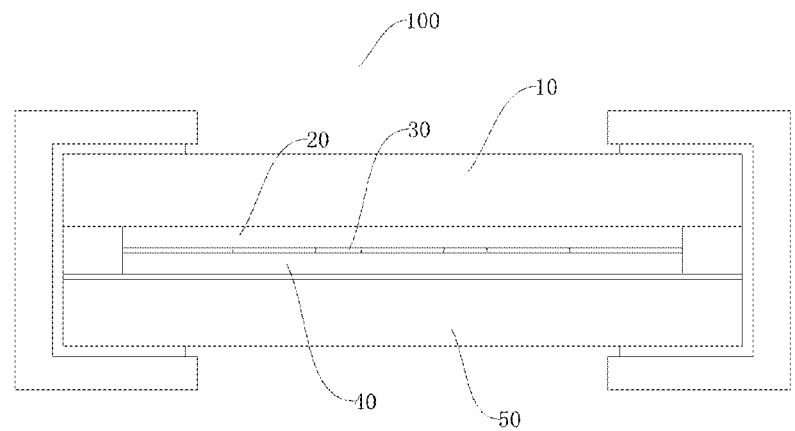
FIG. 10 is a schematic diagram of a solar cell module according to embodiments of the present disclosure.
Figure 11:
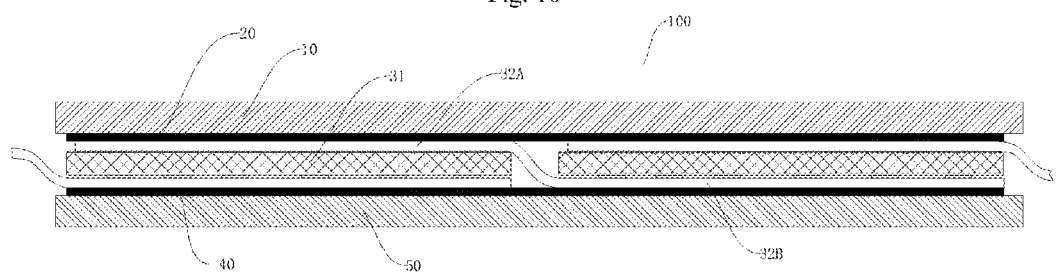
FIG. 11 is a sectional view of part of the solar cell module according to FIG. 10.
Figure 12:
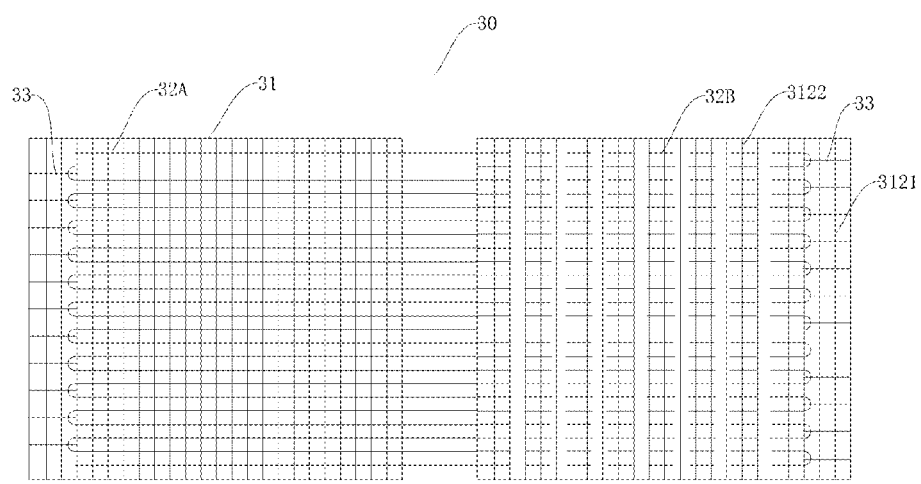
FIG. 12 is a schematic diagram of a solar cell array according to another embodiment of the present disclosure.

As shown in FIG. 10 and FIG. 11, the solar cell module 100 according to embodiments of the present disclosure includes an upper cover plate 10, a front adhesive layer 20, the cell array 30, a back adhesive layer 40 and a back plate 50 superposed sequentially along a direction from up to down.

The front adhesive layer 20 and the back adhesive layer 40 are adhesive layers commonly used in the art. Preferably, the front adhesive layer 20 and the back adhesive layer 40 are polyethylene-octene elastomer (POE) and/or ethylene-vinyl acetate copolymer (EVA). In the present disclosure, polyethylene-octene elastomer (POE) and/or ethylene-vinyl acetate copolymer (EVA) are conventional products in the art, or can be obtained in a method known to those skilled in the art.

In the embodiments of the present disclosure, the upper cover plate 10 and the back plate 50 can be selected and determined by conventional technical means in the art. Preferably, the upper cover plate 10 and the back plate 50 are transparent plates respectively, for example, glass plates.

In the process of manufacturing the solar cell module 100, the conductive wire can be first welded with the secondary grid lines and the back electrode of the cell 31, and then superposed and laminated.

Other components of the solar cell module 100 according to the present disclosure are known in the art, which will be not described in detail herein.

Specifically, the solar module 100 includes an upper cover plate 10, a front adhesive layer 20, the cell array 30, a back adhesive layer 40 and a back plate 50. The cell array 30 includes a plurality of cells 31, and adjacent cells 31 are connected by the plurality of conductive wires 32. The conductive wires 32 are constituted by the metal wire S which extends reciprocally between surfaces of adjacent cells. The conductive wires 32 are welded with the secondary grid lines. The front adhesive layer 20 contacts with the conductive wires 32 directly and fills between the adjacent conductive wires 32.

That's to say, the solar cell module 100 according to the present disclosure includes an upper cover plate 10, a front adhesive layer 20, the cell array 30, a back adhesive layer 40 and a back plate 50 superposed sequentially along a direction from up to down. The cell array 30 includes a plurality of cells 31 and conductive wires 32 for connecting the plurality of cells 31. The conductive wires are constituted by the metal wire S which extends reciprocally between surfaces of two adjacent cells 31.

The conductive wires 32 are electrically connected with the cells 31, in which the front adhesive layer 20 on the cells 31 contacts with the conductive wires 32 directly and fills between the adjacent conductive wires 32, such that the front adhesive layer 20 can fix the conductive wires 32, and separate the conductive wires 32 from air and moisture from the outside world, so as to prevent the conductive wires 32 from oxidation and to guarantee the photoelectric conversion efficiency.

Thus, in the solar cell module 100 according to embodiments of the present disclosure, the conductive wires 32 constituted by the metal wire S which extends reciprocally replace traditional primary grid lines and solder strips, so as to reduce the cost. The metal wire S extends reciprocally to decrease the number of free ends of the metal wire S and to save the space for arranging the metal wire S, i.e. without being limited by the space. The number of the conductive wires 32 constituted by the metal wire which extends reciprocally may be increased considerably, which is easy to manufacture, and thus is suitable for mass production. The front adhesive layer 20 contacts with the conductive wires 32 directly and fills between the adjacent conductive wires 32, which can effectively isolate the conductive wires from air and moisture to prevent the conductive wires 32 from oxidation to guarantee the photoelectric conversion efficiency.

In some specific embodiments of the present disclosure, the metal wire S extends reciprocally between a front surface of a first cell and a back surface of a second cell adjacent to the first cell; the front adhesive layer 20 contacts with the conductive wires on the front surface of the first cell 31 directly and fills between the adjacent conductive wires 32 on the front surface of the first cell 31; the back adhesive layer 40 contacts with the conductive wires 32 on the back surface of the second cell 31 directly and fills between the adjacent conductive wires 32 on the back surface of the second cell 31.

In other words, in the present disclosure, the two adjacent cells 31 are connected by the metal wire S. In the two adjacent cells 31, the front surface of the first cell 31 is connected with the metal wire S, and the back surface of the second cell 31 is connected with the metal wire S.

The front adhesive layer 20 on the first cell 31 whose front surface is connected with the metal wire S is in direct contact with the metal wire S on the front surface of the first cell 31 and fills between the adjacent conductive wires 32. The back adhesive layer 40 on the second cell 31 whose back surface is connected with the metal wire S is in direct contact with the metal wire S on the back surface of the second cell 31 and fills between the adjacent conductive wires 32 (as shown in FIG. 2).

Consequently, in the solar cell module 100 according to the present disclosure, not only the front adhesive layer 20 can separate the conductive wires 32 on the front surfaces of part of the cells 31 from the outside world, but also the back adhesive layer 40 can separate the conductive wires 32 on the back surfaces of part of the cells 31 from the outside world, so as to further guarantee the photoelectric conversion efficiency of the solar cell module 100.

In some specific embodiments of the present disclosure, for a typical cell with a dimension of 156 mm×156 mm, the solar cell module has a series resistance of 380 to 440 mΩ per 60 cells. The present disclosure is not limited to 60 cells, and there may be 30 cells, 72 cells, etc. When there are 72 cells, the series resistance of the solar cell module is 456 to 528 mΩ, and the electrical performance of the cells is better.

In some specific embodiments of the present disclosure, for a typical cell with a dimension of 156 mm×156 mm, the solar cell module has an open-circuit voltage of 37.5-38.5 V per 60 cells. The present disclosure is not limited to 60 cells, and there may be 30 cells, 72 cells, etc. The short-circuit current is 8.9 to 9.4 A, and is not related to the number of the cells.

In some specific embodiments of the present disclosure, the solar cell module has a fill factor of 0.79 to 0.82, which is independent from the dimension and number of the cells, and can affect the electrical performance of the cells.

In some specific embodiments of the present disclosure, for a typical cell with a dimension of 156 mm×156 mm, the solar cell module has a working voltage of 31.5-32 V per 60 cells. The present disclosure is not limited to 60 cells, and there may be 30 cells, 72 cells, etc. The working current is 8.4 to 8.6 A, and is not related to the number of the cells.

In some specific embodiments of the present disclosure, for the normal cell with a dimension of 156 mm×156 mm, the solar cell module has a conversion efficiency of 16.5-17.4%, and a power of 265-280 W per 60 cells.

A method for manufacturing the solar cell module 100 according to the embodiments of the present disclosure will be illustrated with respect to FIG. 1 to FIG. 3 and FIG. 7 to FIG. 9.

The method according to the embodiments of the present disclosure includes the following steps: providing a cell 31 which includes a cell substrate 311 and a plurality of secondary grid lines 312 disposed on a front surface of the cell substrate 311, the secondary grid lines 312 consisting of an edge secondary grid line 3121 adjacent to an edge of the cell substrate 311 and a middle secondary grid line 3122 located inside of the edge secondary grid line 3121, the secondary grid line 312 being provided with a welding portion 3123, at least one welding portion 3123 of the edge secondary grid line 3121 having a projection area in the cell substrate 311 larger than a welding portion 3123 of the middle secondary grid line 3122. It is known to those skilled in the art that the secondary grid lies are usually formed by printing silver paste, and the arrangement and shape of the secondary grid lines can be obtained by screen printing, i.e. those skilled in the art know well how to obtain the secondary grid lines of different width, which will not be described in detail.

The conductive wires 32 constituted by a metal wire are connected with the secondary grid lines 312 in the welding portion 3123 to obtain a solar cell unit.

An upper cover plate 10, a front adhesive layer 20, the solar cell 30, a back adhesive layer 40 and a back plate 50 are superposed in sequence, in which a front surface of the cell 31 faces the front adhesive layer 20, a back surface thereof facing the back adhesive layer 40, and laminating them to obtain the solar cell module 100.

Specifically, in the plurality of secondary grid lines 312 of multiple cells, the secondary grid lines 312 at a position where the metal wire goes across and bends at one side of the cells form edge secondary grid lines 3121. The edge secondary grid lines 3121 are located at a position where the metal wire bends, and this part of the edge secondary grid lines 3121 is widened, but the edge secondary grid lines 3121 at the other side remain the same width as the middle secondary grid lines 3122, so as to enhance the connection strength between the conductive wires 32 and the secondary grid liens 312, and to avoid enlarging the shaded area to guarantee the photoelectric conversion efficiency.

The method includes the steps of preparing a solar array 30, superposing the upper cover plate 10, the front adhesive layer 20, the cell array 30, the back adhesive layer 40 and the back plate 50 in sequence, and laminating them to obtain the solar cell module 100. It can be understood that the method further includes other steps, for example, sealing the gap between the upper cover plate 10 and the back plate 50 by a sealant, and fixing the above components together by a U-shape frame, which are known to those skilled in the art, and thus will be not described in detail herein.

The method includes a step of forming a plurality of conductive wires by a metal wire which extends reciprocally on surfaces of cells 31 and is electrically connected with the surfaces of cells 31, such that the adjacent cells 31 are connected by the plurality of conductive wires to constitute a cell array 30.

Figure 7:
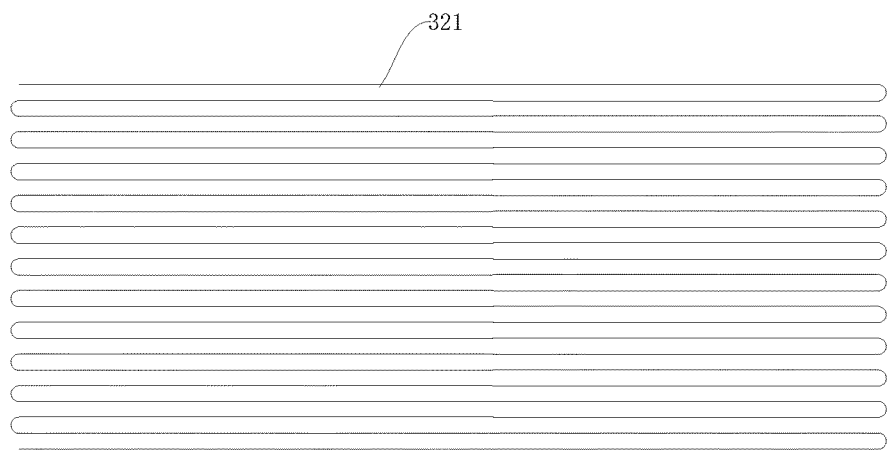
FIG. 7 is a schematic diagram of a metal wire extending reciprocally according to embodiments of the present disclosure.
Figure 8:
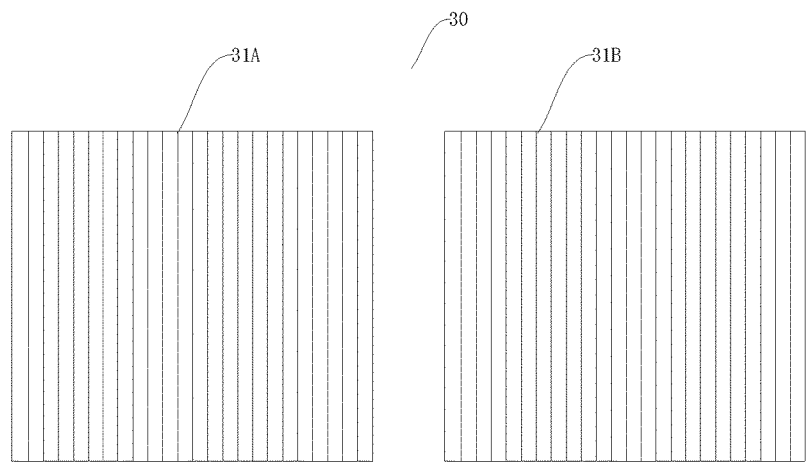
FIG. 8 is a schematic diagram of two cells of a solar cell array according to embodiments of the present disclosure.
Figure 9:
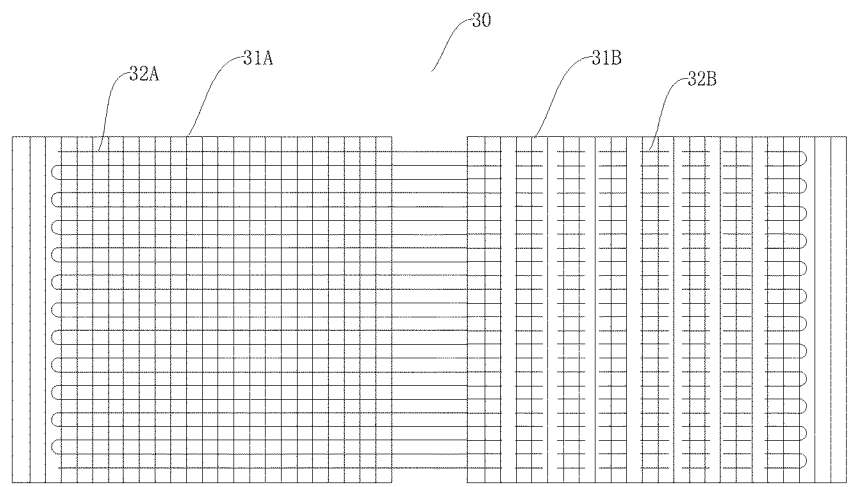
FIG. 9 is a sectional view of a solar cell array formed by connecting, by a metal wire, the two cells according to FIG. 8.

Specifically, as shown in FIG. 7, the metal wire extends reciprocally for 12 times under a strain. As shown in FIG. 8, a first cell 31 and a second cell 31 are prepared. As shown in FIG. 9, a front surface of the first cell 31 is connected with a metal wire, and a back surface of the second cell 31 is connected with the metal wire, such that the cell array 30 is formed. FIG. 9 shows two cells 31. When the cell array 30 has a plurality of cells 31, the metal wire which extends reciprocally connects the front surface of the first cell 31 and the back surface of the second cell 31 adjacent to the first cell 31, i.e. connecting a secondary grid line of the first cell 31 with a back electrode of the second cell 31 by the metal wire. The metal wire extends reciprocally under strain from two clips at two ends thereof. The metal wire can be winded only with the help of two clips, which saves the clips considerably and then reduces the assembling space.

In the embodiment shown in FIG. 9, the adjacent cells are connected in series. As said above, the adjacent cells can be connected in parallel by the metal wire based on practical requirements.

The cell array 30 obtained is superposed with the upper cover plate 10, the front adhesive layer 20, the back adhesive layer 40 and the back plate 50 in sequence, in which a front surface of the cell 31 faces the front adhesive layer 20, a back surface thereof facing the back adhesive layer 40, and laminating them to obtain the solar cell module 100. It can be understood that the metal wire can be bounded or welded with the cell 31 when or before they are laminated.

The front adhesive layer 20 is disposed in direct contact with the conductive wires 32. In the process of laminating, the front adhesive layer 20 melts and fills the gaps between adjacent conductive wires 32. The back adhesive layer 40 is disposed in direct contact with the conductive wires 32. In the process of laminating, the back adhesive layer 40 melts and fills the gaps between adjacent conductive wires 32.

EXAMPLE 1

Example 1 is used to illustrate the solar cell module 100 according to the present disclosure and the manufacturing method thereof.

(1) Manufacturing a Metal Wire S

An alloy layer of Sn40%-Bi55%-Pb5% (melting point: 125° C.) is attached to a surface of a copper wire, in which the copper wire has a cross section of 0.04 mm², and the alloy layer has a thickness of 16 μm. Hence, the metal wire S is obtained.

(2) Manufacturing a Solar Cell Module 100

A POE adhesive layer in 1630×980×0.5 mm are provided (melting point: 65° C.), and a glass plate in 1633×985×3 mm and a polycrystalline silicon cell 31 in 156×156×0.21 mm are provided correspondingly. The cell 31 has 91 secondary grid lines, each of which substantially runs through the cell 31 in a longitudinal direction, and the distance between the adjacent secondary grid lines is 1.7 mm. The cell 31 has five back electrodes (tin, 1.5 mm in width, 10 μm in thickness) on its back surface. Each back electrode substantially runs through the cell 31 in a longitudinal direction, and the distance between the adjacent back electrodes is 31 mm.

The secondary grid lines 312 are made of silver. Each secondary grid line 312 is provided with welding portions 3123. In the plurality of the secondary grid lines 312, the welding portions 3123 on the edge secondary grid lines 3121 close to an edge have a projection area of 0.3 mm$^2$, and the welding portions 3123 on the other secondary grid lines 312 have a projection area of 0.05 mm$^2$, and a thickness of 9 μm.

60 cells 31 are arranged in a matrix form (six rows and ten columns). In two adjacent cells 31, the metal wire extends reciprocally between a front surface of a first cell 31 and a back surface of a second cell under strain. On the two adjacent cells 31, the edge secondary grid lines 3121 with a broadened width are located at a position where the metal wire go across and are welded with the metal wire.

The metal wire extends reciprocally under strain from two clips at two ends thereof, so as to form 15 parallel conductive wires. The secondary grid lines of the first cell 31 are welded with the conductive wires and the back electrodes of the second cell 31 are welded with the conductive wires at a welding temperature of 160° C. The distance between parallel adjacent conductive wires is 9.9 mm. 10 cells are connected in series into a row, and six rows of the cells of such kind are connected in series into a cell array via the bus bar.

Then, an upper glass plate, an upper POE adhesive layer, multiple cells arranged in a matrix form and welded with the metal wire, a lower POE adhesive layer and a lower glass plate are superposed sequentially from up to down, in which the front surface of the cell 31 faces the front adhesive layer 20, such that the front adhesive layer 20 contacts with the conductive wires 32 directly; and the back surface of the cell 31 faces the back adhesive layer 40, and finally they are laminated in a laminator, in which the front adhesive layer 20 fills between adjacent conductive wires 32. In such way, a solar cell module A1 is obtained.

COMPARISON EXAMPLE 1

The difference of Comparison example 1 and Example 1 lies in that the welding portions 3123 on all the secondary grid lines 312 of the cell 31 have the same area, i.e. 0.05 mm$^2$. The metal wire extends reciprocally between a front surface of a first cell 31 and a back surface of a second cell under strain, and is welded with the secondary grid lines 312, so as to obtain a solar cell module D1.

EXAMPLE 2

Example 2 is used to illustrate the solar cell module 100 according to the present disclosure and the manufacturing method thereof.

(1) Manufacturing a Conductive Wire

A copper wire is attached to an alloy layer of Sn40%-Bi55%-Pb5% (melting point: 125° C.), in which the copper wire has a cross section of 0.03 mm$^2$, and the alloy layer has a thickness of 10 μm, so as to obtain the conductive wire.

(2) Manufacturing a Solar Cell Module

A EVA adhesive layer in 1630×980×0.5 mm are provided (melting point: 60° C.), and a glass plate in 1633×985×3 mm and a polycrystalline silicon cell 31 in 156×156×0.21 mm are provided correspondingly. The cell 31 has 91 secondary grid lines, each of which substantially runs through the cell 31 in a longitudinal direction, and the distance between the adjacent secondary grid lines is 1.7 mm. The cell 31 has five back electrodes (tin, 1.5 mm in width, 10 μm in thickness) on its back surface. Each back electrode substantially runs through the cell 31 in a longitudinal direction, and the distance between the adjacent back electrodes is 31 mm.

The secondary grid lines 312 are made of silver. Each secondary grid line 312 is provided with welding portions 3123. In the plurality of the secondary grid lines 312, the welding portions 3123 on the edge secondary grid lines 3121 close to an edge have a projection area of 0.6 mm$^2$, and the welding portions 3123 on the other secondary grid lines 312 have a projection area of 0.08 mm$^2$, and a thickness of 9 μm.

The cells 31 are arranged in a matrix form. In two adjacent cells 31, the metal wire extends reciprocally between a front surface of a first cell 31 and a back surface of a second cell under a strain, so as to form 20 parallel conductive wires. The secondary grid line of the first cell 31 is welded with the primary grid, and the back electrode of the second cell 31 is welded with the primary grid, and the distance between parallel conductive wires is 7 mm. An upper glass plate, an upper POE adhesive layer, multiple cells arranged in a matrix form and welded with the metal wire, a lower POE adhesive layer and a lower glass plate are superposed sequentially from up to down, in which the shiny surface of the cell 31 faces the front adhesive layer 20, the shady surface thereof facing the back adhesive layer 40, and they are laminated in a laminator so as to obtain a solar cell module A2.

EXAMPLE 3

The solar cell module is manufactured according to the method in Example 2, but the difference compared with Example 2 lies in that the secondary grid lines 312 are made of silver; each secondary grid line 312 is provided with welding portions 3123; in the plurality of the secondary grid lines 312, the welding portions 3123 on the edge secondary grid lines 3121 close to an edge have a projection area of 1 mm$^2$, and the welding portions 3123 on the other secondary grid lines 312 have a projection area of 0.15 mm$^2$, and a thickness of 9 μm so as to obtain a solar cell module A3.

Performance Test (1) Whether the metal wire in the solar cell module drifts is observed with the naked eyes;

(2) Welding-binding force test between the edge secondary grid lines and the metal wire:

The welding-binding force in the solar cell modules A1-A5 and D1 will be tested in the following method respectively:

1. Placing the cell horizontally at a testing position of a tensile tester, and pressing blocks on the cell, in which the pressing blocks are disposed at two sides of the metal wire, such that the cell will not be pulled up during the test;

2. Clamping the metal wire at a pull ring of a tension meter that forms an angle of 45° with the cell;

3. Actuating the tension meter, such that the tension meter moves uniformly along a vertical direction, pulls up the metal wire from the surface of the cell and records the pull data tested, in which the data is averaged to obtain the pull data of the metal wire.

(3) Photoelectric Conversion Efficiency Test

According to the method disclosed in IEC904-1, the solar cell modules manufactured in the above examples and the comparison example are tested with a single flash simulator under standard test conditions (STC): 1000 W/m² of light intensity, AM1.5 spectrum, and 25° C. The photoelectric conversion efficiency of each cell is recorded. The testing result is shown in Table 1.

TABLE 1

| Solar cell module | A1 | D1 | A2 | A3 |
|---|---|---|---|---|
| Insufficient welding | No | Yes | No | No |
| Welding-binding force (N) | 0.32 | 0.1 | 0.41 | 0.58 |
| Photoelectric conversion efficiency (%) | 16.3 | 15.4 | 16.8 | 17.1 |

It can be indicated from FIG. 1 that for the solar cell module according to the embodiments of the present disclosure, at the edges of the cell, the welding-binding force between the conductive wires and the secondary grid lines is strong with high welding stability, and will not detach or be insufficiently welded, and can obtain higher photoelectric conversion efficiency can be obtained.

In the specification, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise," and "counterclockwise" should be construed to refer to the orientation as then described or as shown in the drawings under discussion. These relative terms are for convenience of description and do not require that the present disclosure be constructed or operated in a particular orientation.

In addition, terms such as "first" and "second" are used herein for purposes of description and are not intended to indicate or imply relative importance or significance or to imply the number of indicated technical features. Thus, the feature defined with "first" and "second" may comprise one or more of this feature. In the description of the present disclosure, "a plurality of" means two or more than two, unless specified otherwise.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Reference throughout this specification to "an embodiment," "some embodiments," or "some examples" means that a particular feature, structure, material, or characteristic described in connection with the embodiment or example is included in at least one embodiment or example of the present disclosure. Thus, these terms throughout this specification do not necessarily refer to the same embodiment or example of the present disclosure. Furthermore, the particular features, structures, materials, or characteristics may be combined in any suitable manner in one or more embodiments or examples.

Although embodiments of the present disclosure have been shown and described, it would be appreciated by those skilled in the art that changes, modifications, alternatives and variations can be made in the embodiments without departing from the scope of the present disclosure.

What is claimed is:

1. A solar cell unit, comprising:
   a cell including a cell substrate and a plurality of secondary grid lines disposed on a front surface of the cell substrate, the secondary grid lines comprising at least two edge secondary grid lines and a middle secondary grid line, wherein:
   each of the at least two edge secondary grid lines is adjacent to an edge of the cell substrate,
   the middle secondary grid line is disposed inside a region defined by the at least two edge secondary grid lines, and
   the at least two edge and middle secondary grid lines each comprises a welding portion, the welding portion of each of the at least two edge secondary grid lines having a projection area in the cell substrate larger than the welding portion of the middle secondary grid line; and
   a plurality of conductive wires spaced apart from each other and welded with the secondary grid lines in the welding portions.

2. The solar cell unit according to claim 1, wherein the welding portion of each of the at least two edge secondary grid lines has a width in a direction orthogonal to the secondary grid lines greater than a width of the welding portion of the middle secondary grid line.

3. The solar cell unit according to claim 1, wherein the at least two edge secondary grid lines between adjacent welding portions of the at least two edge secondary grid lines have a width equal to that of the middle secondary grid line between adjacent welding portions of the middle secondary grid line.

4. The solar cell unit according to claim 1, wherein the welding portion of the at least two edge secondary grid lines has a length larger than that of the at least two edge secondary grid lines between adjacent welding portions of the at least two edge secondary grid lines.

5. The solar cell unit according to claim 1, wherein each of the at least two edge secondary grid lines is a secondary grid line adjacent to a side of the cell.

6. The solar cell unit according to claim 1, wherein the at least two edge secondary grid lines have a width greater than the middle secondary grid line.

7. A solar cell array, comprising a plurality of solar cell units according to claim 1, cells of adjacent cell units being connected by the plurality of conductive wires.

8. The solar cell array according to claim 7, wherein the plurality of conductive wires comprises a metal wire; and the metal wire extends reciprocally between a surface of a first cell and a surface of a second cell adjacent to the first cell.

9. The solar cell array according to claim 8, wherein the metal wire extends reciprocally between a front surface of the first cell and a back surface of the second cell.

10. The solar cell array according to claim 8, wherein a back electrode is disposed on the back surface of the substrate, and the metal wire is welded with the back electrode of the second cell.

11. The solar cell array according to claim 8, wherein the metal wire extends reciprocally between the front surface of the first cell and the back surface of the second cell for 10 to 60 times.

12. The solar cell array according to claim 8, wherein the cells are arranged in an n×m matrix form, n representing a column, and m representing a row;

in a row of cells, the metal wire extends reciprocally between a surface of a first cell and a surface of a second cell adjacent to the first cell; in two adjacent rows of cells, the metal wire extends reciprocally between a surface of a cell in a $a^{th}$ row and a surface of a cell in a $(a+1)^{th}$ row; and m−1≥a≥1.

13. The solar cell array according to claim 12, wherein in two adjacent rows of cells, the metal wire extends reciprocally between a surface of a cell at an end of the $a^{th}$ row and a surface of a cell at an end of the $(a+1)^{th}$ row, the end of the $a^{th}$ row and the end of the $(a+1)^{th}$ row located at the same side of the matrix form.

14. The solar cell array according to claim 12, wherein in a row of cells, the metal wire extends reciprocally between a front surface of a first cell and a back surface of a second cell adjacent to the first cell; in two adjacent rows of cells, the metal wire extends reciprocally between a front surface of the cell at the end of the $a^{th}$ row and a back surface of the cell at the end of the $(a+1)^{th}$ row, to connect the two adjacent rows of cells in series.

15. The solar cell array according to claim 12, wherein one metal wire extends reciprocally between adjacent cells in a row; and another metal wire extends reciprocally between cells in adjacent rows.

16. The solar cell array according to claim 8, wherein the metal wire is coated with a welding layer, and the welding layer contains Sn, and at least one of Bi, In, Ag, Sb, Pb and Zn.

17. The solar cell array according to claim 16, wherein the welding layer contains Sn, Bi, and at least one of In, Ag, Sb, Pb and Zn.

18. A solar cell module, comprising an upper cover plate, a front adhesive layer, a solar cell array of claim 7, a back adhesive layer and a back plate superposed in sequence.

* * * * *